(12) United States Patent
Nakashima

(10) Patent No.: US 8,661,704 B2
(45) Date of Patent: Mar. 4, 2014

(54) SUBSTRATE PROCESSING APPARATUS

(71) Applicant: Tokyo Electron Limited, Tokyo (JP)

(72) Inventor: Mikio Nakashima, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/625,980

(22) Filed: Sep. 25, 2012

(65) Prior Publication Data

US 2013/0081297 A1 Apr. 4, 2013

(30) Foreign Application Priority Data

Sep. 29, 2011 (JP) ................................. 2011-215116

(51) Int. Cl.
*F26B 11/18* (2006.01)
*F26B 25/18* (2006.01)
*F26B 21/14* (2006.01)
*F26B 3/00* (2006.01)

(52) U.S. Cl.
USPC ......... 34/198; 34/200; 34/74; 34/351; 34/469

(58) Field of Classification Search
USPC ......... 34/215, 216, 220, 201, 72, 73, 74, 337, 34/341, 348, 351, 352, 467, 468, 469, 470, 34/471, 198, 200, 77, 78, 80; 134/95.2, 134/90, 91, 105, 106, 34, 35; 392/403, 386, 392/405, 399–401; 122/20 R, 4 D; 432/247; 159/27.3; 29/890.07; 196/99; 73/179.19
See application file for complete search history.

(56) References Cited

U.S. PATENT DOCUMENTS

| 5,715,612 | A  | * | 2/1998 | Schwenkler | ............. | 34/470 |
| 5,752,532 | A  | * | 5/1998 | Schwenkler | ............. | 34/470 |
| 6,965,732 | B2 | * | 11/2005 | Golan | ..................... | 392/399 |
| 2001/0037822 | A1 | * | 11/2001 | Elsawy et al. | ............. | 134/95.2 |
| 2010/0058606 | A1 | * | 3/2010 | Nakashima et al. | ......... | 392/400 |

FOREIGN PATENT DOCUMENTS

JP 2008-72118 A 3/2008

\* cited by examiner

*Primary Examiner* — Kenneth Rinehart
*Assistant Examiner* — Tavia Sullens
(74) *Attorney, Agent, or Firm* — Abelman, Frayne & Schwab

(57) ABSTRACT

Provided is substrate processing apparatus including processing chamber that dries substrate W using high temperature and high pressure fluid, raw material accommodating unit that accommodates raw material in liquid state, and supplying unit that supplies the high temperature and high pressure fluid to the processing chamber. The supplying unit includes sealable outer vessel connected to the processing chamber and the raw material accommodating unit, and inner vessel provided within the outer vessel and configured to receive the raw material. The inner vessel is provided with opened holes portions configured to drop down the raw material toward a portion of the outer vessel to be heated. After the raw material is accommodated in the inner vessel, the raw material is contacted with the portion to be heated and then heated. A high temperature and high pressure fluid is then obtained and supplied to the processing chamber.

5 Claims, 10 Drawing Sheets

SUBSTRATE PROCESSING APPARATUS

CROSS-REFERENCE TO RELATED APPLICATIONS

This application is based on and claims priority from Japanese Patent Application No. 2011-215116, filed on Sep. 29, 2011, with the Japanese Patent Office, the disclosure of which is incorporated herein in its entirety by reference.

TECHNICAL FIELD

The present disclosure relates to a technology that dries a substrate to be processed, which has been subjected to a processing such as a cleaning, using a high temperature and high pressure fluid.

BACKGROUND

A process of manufacturing a semiconductor device in which a stacking structure of an integrated circuit is formed on the surface of a substrate to be processed such as a semiconductor wafer (hereinafter, referred to as a "wafer") includes a liquid process of processing a wafer surface using a liquid to remove minute dusts or native oxide layers on the wafer surface using a cleaning liquid such as, for example, a chemical solution.

For example, a single type spin cleaning apparatus for cleaning a wafer removes dusts or native oxides on the wafer surface by rotating the wafer while supplying, for example, alkaline or acid chemical solutions to the wafer surface using a nozzle. In this case, the wafer surface is dried by, for example, a spin drying in which remaining chemical solutions are removed from the wafer surface by rinse cleaning using, for example, deionized water (DIW), and then remaining liquids are brushed away while rotating the wafer.

However, as a semiconductor device is highly integrated, a problem such as so-called a pattern collapse has grown serious in a processing of removing such liquids. The pattern collapse is a phenomenon in which the balance of a surface tension horizontally pulling a convex portion is lost, and as a result, the convex portion falls down toward a side where more liquids remain at the time of drying the remaining liquids on the wafer surface, as the liquids which remain at, for example, the left and right sides of the convex portion of concave-convex portions forming a pattern, are unevenly dried.

A drying method has been known, which uses a fluid of supercritical state (a supercritical fluid), which is a kind of high temperature and high pressure fluids, as a method for removing the remaining liquid from the wafer surface while suppressing the occurrence of the above-described pattern collapse. The supercritical fluid has viscosity which is lower than that of a liquid and a high level of capability to dissolve a liquid. In addition, there is no interface between a supercritical fluid and a liquid or a gas which is in an equilibrium state with the supercritical fluid. In a wafer attached with a liquid, the liquid is substituted with a supercritical fluid, and then the supercritical fluid is changed to a gaseous state. As a result, the liquid can be dried without being influenced by a surface tension.

Applicant is developing a single type wafer processing apparatus which repeats a series of operations including heating a raw material in a liquid state ("a liquid raw material") to generate a supercritical fluid and supplying the supercritical fluid into an atmosphere where a wafer is disposed, to dry a liquid on the wafer surface for every wafer processing. At this time, if a necessary amount of supercritical fluid is generated for every wafer processing, there is no need to prepare and store much supercritical fluids in advance, and thus, it may cause a compact wafer processing apparatus.

As a method for preparing a necessary amount of supercritical fluid for every wafer processing, a method may be considered in which a liquid raw material is transported to, for example, a metallic vessel, the vessel is sealed, and then the temperature and pressure of the liquid raw material are raised by heating the body of the vessel to indirectly heat the liquid raw material. However, the vessel of which inside becomes a high temperature and high pressure atmosphere has to get a sufficient pressure-resistant property, the thermal capacity thereof is high, and the responsibility thereof at the time of performing a temperature control is poor.

When a liquid raw material for the next processing is transported to a vessel which is once heated to a supercritical temperature or more, the liquid raw material that contacts with the vessel body begins a vaporization to raise the inner pressure of the vessel. For that reason, a high pressure pump is necessary for a transportation of the liquid raw material or a cooling mechanism that cools a vessel body is necessary, and as a result, the facility cost may be increased or the supercritical fluid needs to be prepared for a long time.

Herein, Japanese Patent Application Laid-Open No. 2008-72118 (see, e.g., paragraphs [0025] to [0029], paragraphs [0038] and [0039], and FIG. 1) discloses a technology in which a substrate to be processed is dried by transporting a substrate cleaned in a cleaning unit into a dry processing chamber, raising the pressure inside the dry processing chamber in advance to be equal to or higher than a critical pressure of a dry processing fluid (in the present exemplary embodiment, a carbon dioxide), and thereafter, supplying a supercritical fluid into the dry processing chamber. However, Japanese Patent Application Laid-Open No. 2008-72118 does not disclose a technology for preparing a supercritical fluid from a liquid raw material, and does not disclose a method for solving the problems as described above.

SUMMARY

A substrate processing apparatus according to the present disclosure includes a processing chamber configured to dry a substrate using a high temperature and high pressure fluid, a raw material accommodating unit configured to accommodate a raw material in a liquid state, and a supplying unit configured to supply the raw material received from the raw material accommodating unit to the processing chamber with a state of high temperature and high pressure fluid. The supplying unit includes a sealable outer vessel configured to be connected to the processing chamber through a high temperature and high pressure fluid supplying path having an opening/closing valve and to the raw material accommodating unit through a raw material supplying path having an opening/closing valve, a heating mechanism configured to heat the outer vessel, an inner vessel provided within the outer vessel while communicating with the inner atmosphere of the outer vessel and configured to receive the raw material from the raw material accommodating unit, and opened holes portions formed in the inner vessel to drop down the raw material received from the raw material accommodating unit toward a portion of the outer vessel to be heated which is heated by the heating mechanism. After the raw material is accommodated in the inner vessel, the raw material is contacted with the portion to be heated and then is heated under the atmosphere of the sealed outer vessel thereby obtaining a high temperature and high pressure fluid to be supplied to the processing chamber.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
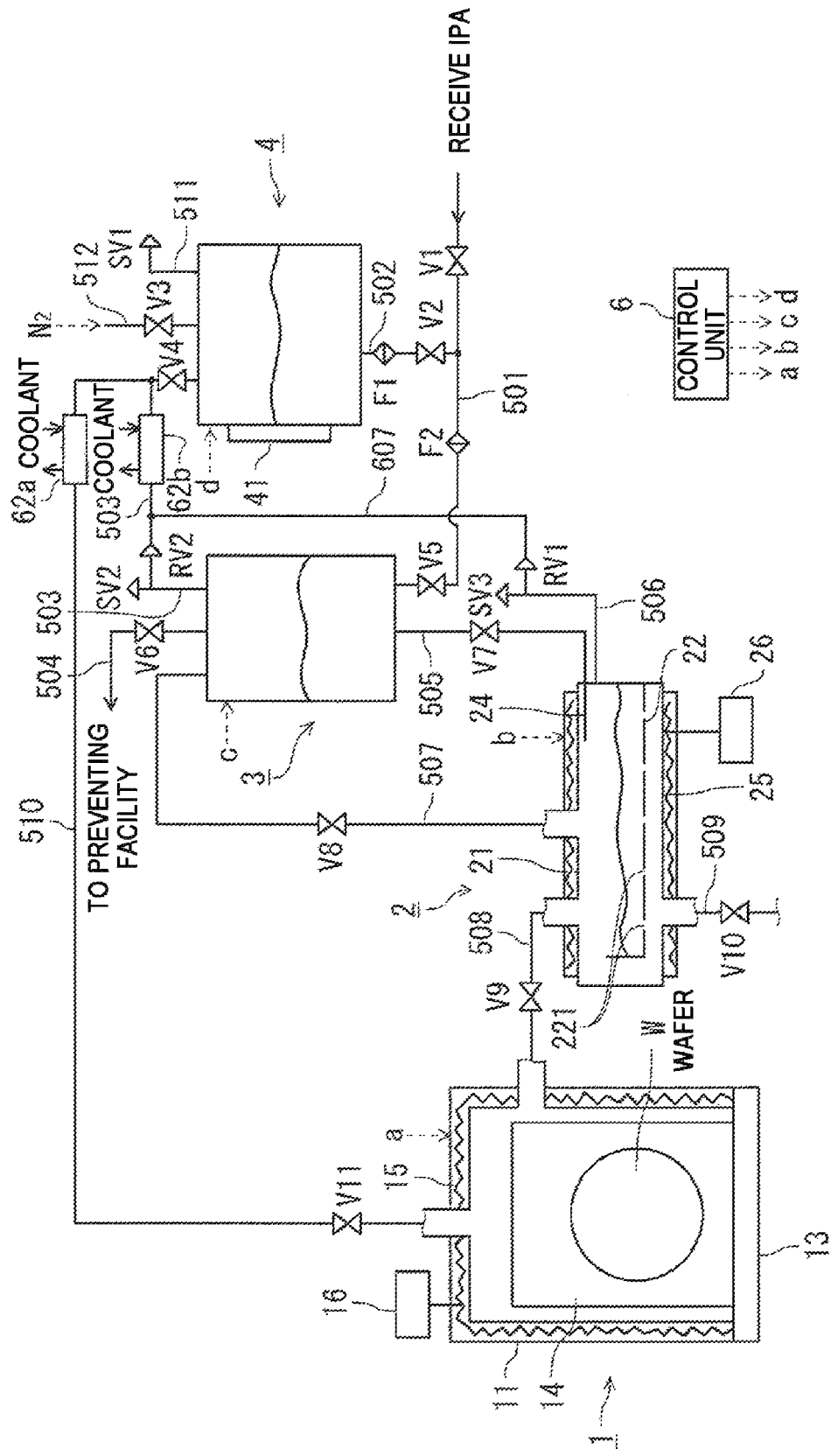
FIG. 1 is an explanatory view illustrating an entire configuration of a wafer processing apparatus according to an exemplary embodiment of the present disclosure.

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

The present disclosure is made in an effort to provide a substrate processing apparatus capable of suppressing a sudden pressure variation of a vessel in which a high temperature and high pressure fluid is prepared, and transporting a liquid raw material in a relatively simple manner.

A substrate processing apparatus according to an exemplary embodiment of the present disclosure includes a processing chamber configured to dry a substrate using a high temperature and high pressure fluid, a raw material accommodating unit configured to accommodate a raw material in a liquid state, and a supplying unit configured to supply the raw material received from the raw material accommodating unit to the processing chamber with a state of high temperature and high pressure fluid. The supplying unit includes a sealable outer vessel configured to be connected to the processing chamber through a high temperature and high pressure fluid supplying path having an opening/closing valve and connected to the raw material accommodating unit through a raw material supplying path having an opening/closing valve, a heating mechanism configured to heat the outer vessel, an inner vessel provided within the outer vessel while communicating with the inner atmosphere of the outer vessel and configured to receive the raw material from the raw material accommodating unit, and opened holes portions formed in the inner vessel to drop down the raw material received from the raw material accommodating unit toward a portion of the outer vessel to be heated which is heated by the heating mechanism. After the raw material is accommodated in the inner vessel, the raw material is contacted with the portion to be heated and then is heated under the atmosphere of the sealed outer vessel. As a result, a high temperature and high pressure fluid is obtained and supplied to the processing chamber.

The above-described substrate processing apparatus may have the following features:

(a) The inner vessel is provided within the outer vessel in a state where the inner vessel is spaced from the portion to be heated.

(b) The raw material accommodating unit is disposed in a position higher than the supplying unit so that the raw material therein can flow down toward the inner vessel through the raw material supplying path, and a communication path having an opening/closing valve is provided between the raw material accommodating unit and the outer vessel so that the atmosphere in the raw material accommodating unit can communicate with the atmosphere in the outer vessel when the raw material flows down.

(c) The thermal capacity of the inner vessel is smaller than that of the outer vessel.

(d) The outer vessel is connected to a discharging path having a relief valve so as to discharge some of the high temperature and high pressure fluid therein until the pressure within the outer vessel becomes a setting pressure set in advance when the pressure within the outer vessel exceeds the setting pressure, and the supplying unit supplies the high temperature and high pressure fluid to the processing chamber after the supplying unit receives the raw material of an amount which exceeds the setting pressure from the raw material accommodating unit and the relief valve is driven.

In the present disclosure, the inner vessel is provided in the supplying unit that supplies a liquid raw material to the processing chamber in a state of high temperature and high pressure fluid, the raw material received from the raw material accommodating unit is once received in the inner vessel, and then the raw material drops to the portion of the outer vessel to be heated which is heated by the heating mechanism. Therefore, the raw material may be slowly supplied to the portion to be heated. As a result, a sudden rise of the pressure within the outer vessel is suppressed when the raw material is transported, and the raw material may be readily transported.

As a substrate processing apparatus according to an exemplary embodiment of the present disclosure, the configuration of a wafer processing apparatus will be described with reference to FIGS. 1 to 4, which removes a dry preventing liquid attached to a wafer after performing a liquid processing for the wafer using a cleaning liquid by contacting with IsoPropyl Alcohol (IPA) in a supercritical state (a high temperature and high pressure state) (hereinafter, referred to as "supercritical IPA").

The wafer processing apparatus, as illustrated in FIG. 1, includes a processing chamber 1 in which a processing for removing a liquid attached on a wafer W using supercritical IPA is performed therein, a supplying unit 2 that supplies supercritical IPA (critical temperature: 235, and critical pressure (absolute pressure): 4.8 MPa) to processing chamber 1, and an accommodating unit (a raw material accommodating unit) 3 that accommodates liquid state of IPA which is the raw material of the supercritical IPA, and a recovery tank 4 that collects the IPA having been used in processing chamber 1.

Figure 2:
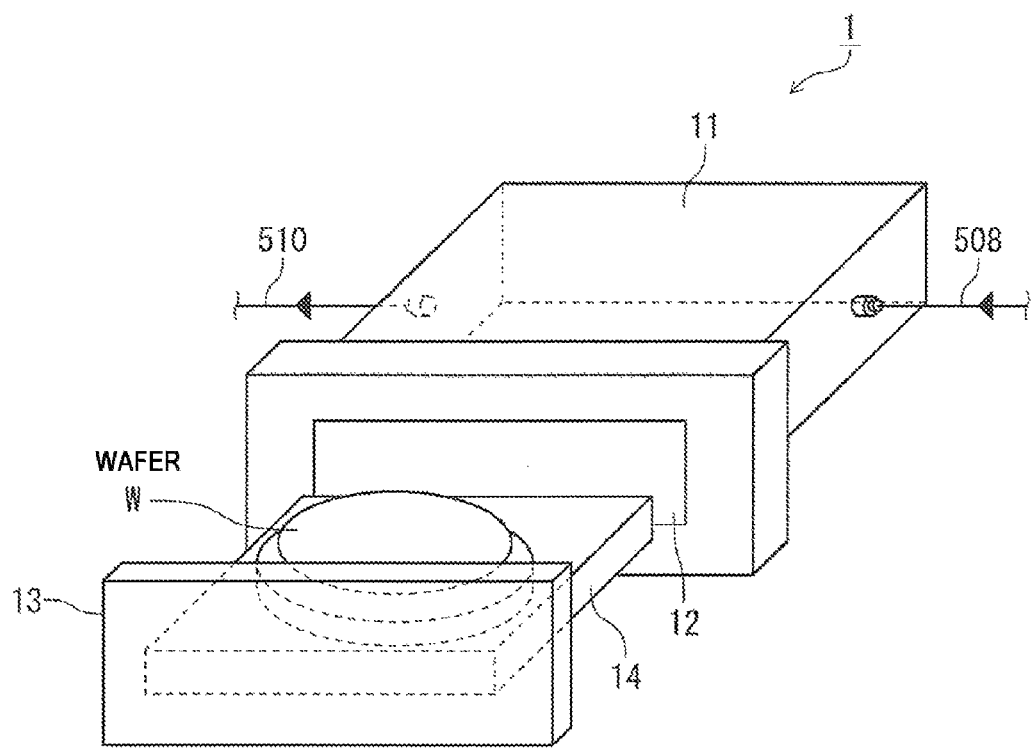
FIG. 2 is a perspective view illustrating a processing chamber provided in the wafer processing apparatus.

As illustrated in FIG. 2, processing chamber 1 includes a chamber body 11 having a shape of a housing with an opening 12 for carrying-in/out wafer W, a holding plate 14 that holds wafer W which is a substrate to be processed in a transverse direction, and a cover member 13 that supports holding plate 14 and seals opening 12 when wafer W is carried-in into chamber body 11.

Chamber body 11 is a metallic chamber in which a processing space of, for example, 200 cm$^3$ to 10,000 cm$^3$ capable of receiving a wafer 300 mm in diameter one by one, and a supplying line (a high temperature and high pressure fluid supplying path) 508 and a discharging line 510 are connected to the wall portion of chamber body 11. Processing chamber 1 is provided with a press mechanism (not illustrated) for sealing the processing space by strongly pushing cover member 13 toward chamber body 11 against the inner pressure caused by the supercritical IPA supplied within the processing space.

As illustrated in FIG. 1, chamber body 11 of processing chamber 1 is provided with a heater 15 for heating the inside of the processing space such that the supercritical IPA supplied into the processing space maintains a supercritical state. Heater 15 is connected to a power supplying unit 16 and the amount of the power supplied from power supplying unit 16 to heater 15 may be adjusted based on a result from measuring a temperature within the processing space using a temperature measuring unit (not illustrated) such that the temperature within the processing space could be maintain at a preset temperature. Heater 15 and power supplying unit 16 constitute a heating mechanism of processing chamber 1.

As illustrated in FIG. 1, supplying unit 2 is connected to an upstream side of supplying line 508 which supplies supercritical IPA to processing chamber 1 via an opening/closing valve V9, and accommodating unit 3 is connected to supplying unit 2.

The configuration of supplying unit 2 will be described with reference to FIGS. 3 and 4. Supplying unit 2 includes an outer vessel 21 constituting a vessel body that accommodates the supercritical IPA and configured to heat the liquid IPA received from accommodating unit 3 in order to change the liquid IPA into a supercritical state of IPA, a heating mechanism configured to heat outer vessel 21, and an inner vessel 22 configured to accommodate first the liquid IPA received from accommodating unit 3 and adjust the amount of liquid IPA that contacts with outer vessel 21 so as to avoid a sudden variation of the pressure within outer vessel 21.

Outer vessel 21 is, for example, a metallic cylindrical-shaped vessel with a pressure-resistant property, and the central axis of the cylinder is arranged transversely toward a horizontal direction. As illustrated in FIG. 4, outer vessel 21 is provided with a heater 25 including, for example, a tape heater so as to cover the side periphery wall of outer vessel 21. As such, in design, the side periphery wall of outer vessel 21 is a portion which is heated by heater 25, and corresponds to a portion to be heated of supplying unit 2. The portion to be heated takes a role to transfer the heat supplied from heater 25 to the liquid IPA so as to change the liquid IPA supplied into outer vessel 21 into a supercritical state.

Heater 25 is connected to a power supplying unit 26, and the amount of the power supplied from power supplying unit 26 to heater 25 may be adjusted based on a result from measuring a temperature within outer vessel 21 using a temperature measuring unit (not illustrated) such that the temperature within outer vessel 21 may be maintained at a preset temperature. Heater 25 and power supplying unit 26 constitute a heating mechanism of supplying unit 2.

An opening is formed in a one side of the left-right ends of outer vessel 21 which is arranged in a transverse direction, and the opening is closed by a cover member 23. Cover member 23 may be fastened to a flange portion 211 formed to surround the opening using, for example, a bolt such that the opening could be air-tightly closed, and constitutes a part of the outer vessel of the present disclosure.

Figure 3:
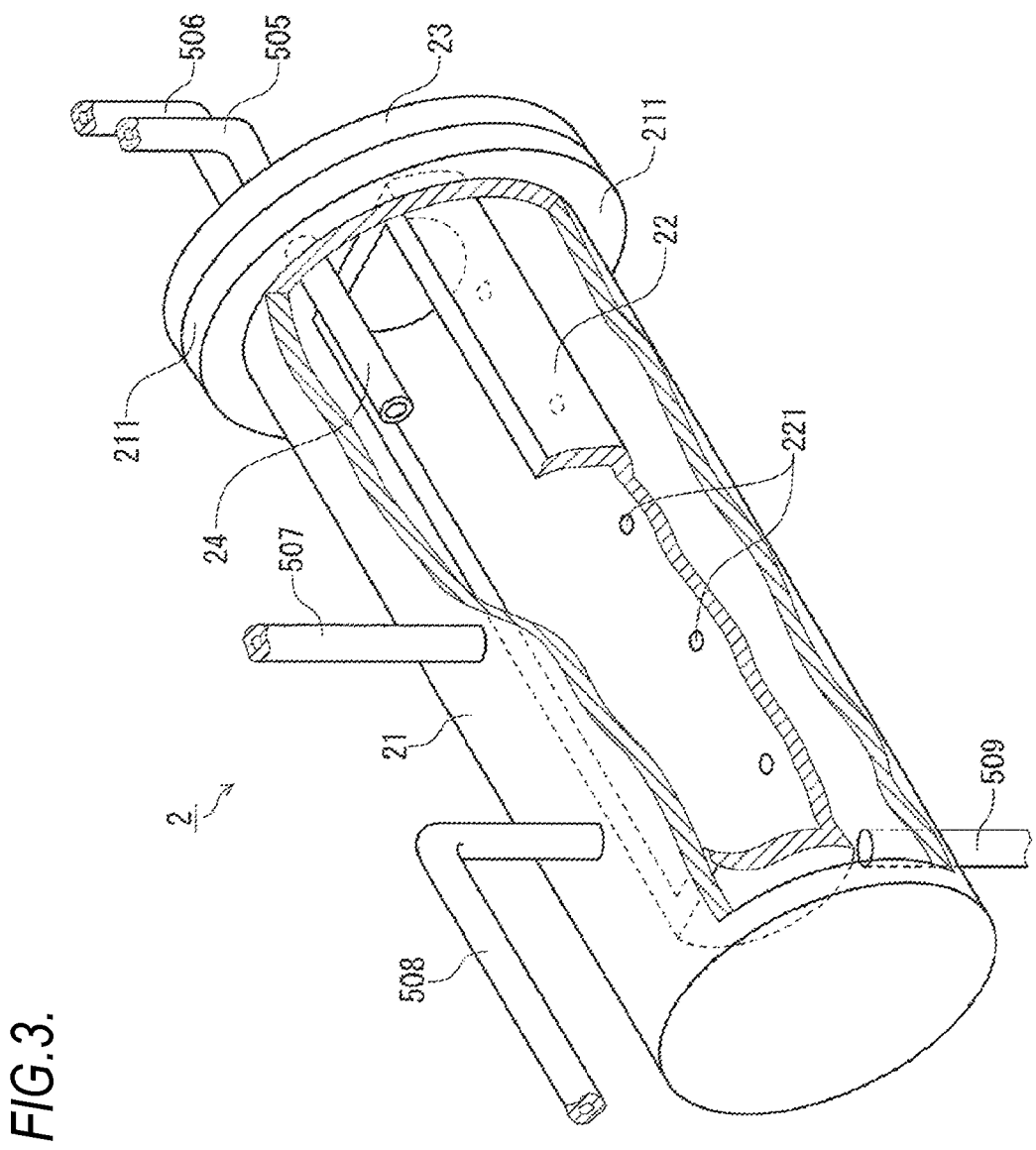
FIG. 3 is a partial fractured perspective view illustrating the configuration of a supercritical IPA supplying unit provided in the wafer processing apparatus.
Figure 4:
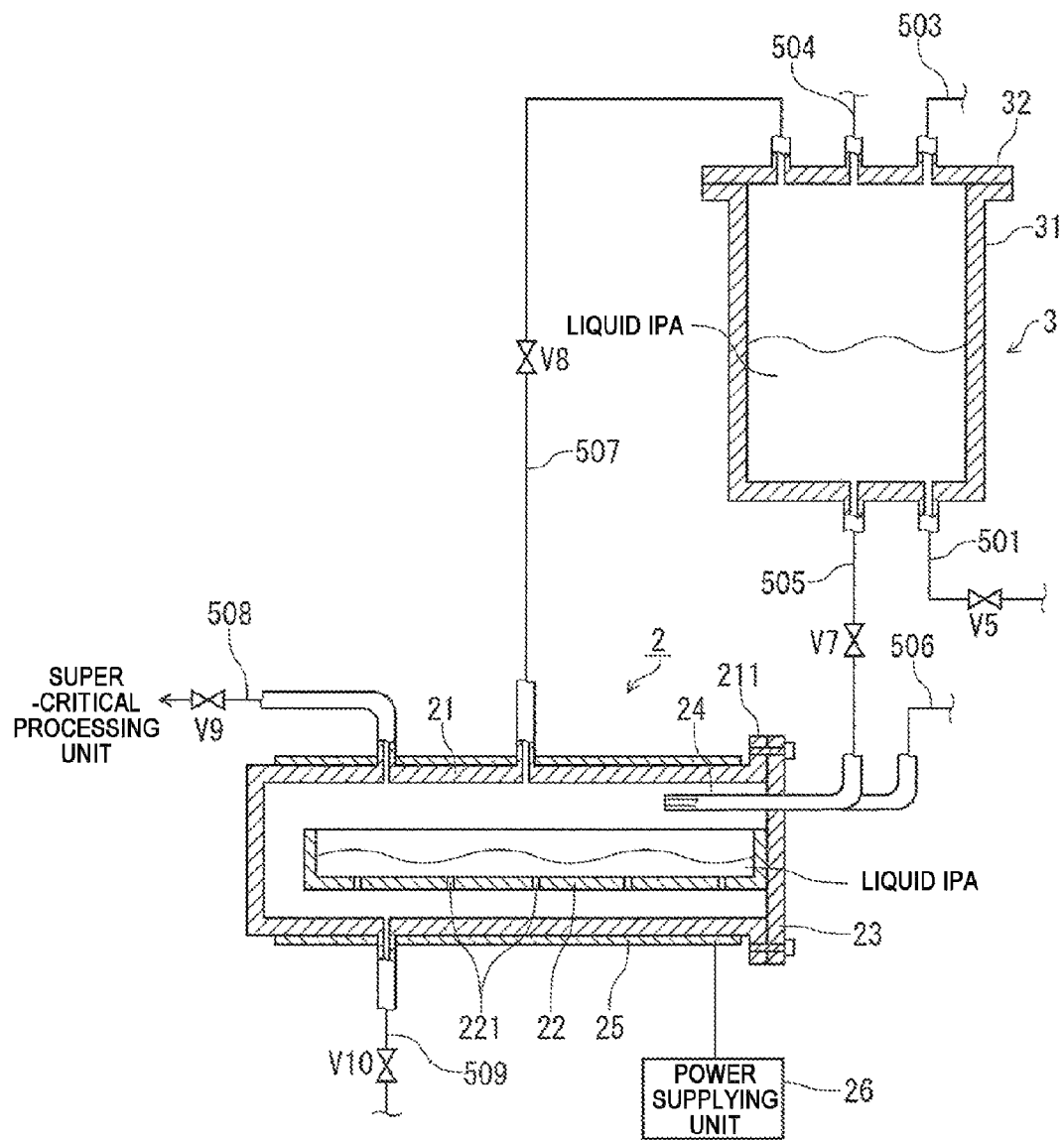
FIG. 4 is a longitudinally cross-sectional side view illustrating the configurations of the supplying unit and a liquid IPA accommodating unit.

As illustrated in FIGS. 3 and 4, inner vessel 22 is attached on the inner wall surface of cover member 23, and inner vessel 22 is inserted into outer vessel 21 by fastening cover member 23 to flange portion 211. For example, inner vessel 22 is a metallic cylindrical-shaped vessel of which diameter is smaller than that of outer vessel 21, the central axis of inner vessel 22 is arranged transversely toward a horizontal direction as in outer vessel 21, and thereby forming a dual cylinder.

The side periphery wall portion at the top side of inner vessel 22 is cut out to open the top side of inner vessel 22 like a gutter, and inner vessel 22 is communicated with the inner atmosphere of outer vessel 21 through the opening. Wall portions are formed in both left-right ends thereof, and thus, inner vessel 22 may store the liquid IPA received through the opening.

As described above, inner vessel 22 and outer vessel 21 constitute a dual cylinder, and inner vessel 22 is arranged at a location spaced from the portion of outer vessel 21 to be heated (inner wall surface of outer vessel 21). As a result, it is difficult to transfer the heat supplied from heater 25 to inner vessel 22 directly, and a rapid evaporation of the liquid IPA is suppressed.

In the present exemplary embodiment, some of the heat supplied from heater 25 is transferred to inner vessel 22 through flange portion 211 or cover member 23, but the effect of the transferred heat from heater 25 to inner vessel 22 is small in comparison with the portion of outer vessel 21 to be heated (side periphery wall of outer vessel 21) which is directly heated by heater 25. Thermal capacity of inner vessel 22 is small in comparison with outer vessel 21 by, for example, using a thinner metallic material as compared to outer vessel 21. Therefore, the temperature of inner vessel 22 tends to be decreased when the heat is taken out at the time of evaporating of the liquid IPA or at the time of expanding of the supercritical IPA. As a result, when the liquid IPA is accommodated, the temperature of inner vessel 22 becomes a temperature capable of maintaining the liquid IPA in a liquid state.

The lower end portion of the cylindrical-shaped side periphery wall of inner vessel 22 (the bottom portion of inner vessel 22) is provided with a plurality of opened holes portions 221 so as to drop down the liquid IPA stored therein toward the portion of outer vessel 21 to be heated (the inner surface of the side periphery wall of outer vessel 21). Opened holes portions 221 are formed spaced from each other along an extending direction of the central axis of cylindrical-shaped inner vessel 22.

The opening diameter of each of opened holes portions 221 is adjusted to a size which is capable of slowing sufficiently the drop flow of the liquid IPA from inner vessel 22 in comparison with the flow rate of supplying the liquid IPA from accommodating unit 3 to inner vessel 22. As a result, the liquid IPA supplied into outer vessel 21 is first accommodated in inner vessel 22, and supplied to the portion of outer vessel 21 to be heated (the inner surface of the side periphery wall of outer vessel 21) while the flow rate is adjusted by opened holes portions 221.

As illustrated in FIG. 4, outer vessel 21 is connected to accommodating unit 3 via a flow down line 505 (a raw material supply path). The lower end of flow down line 505 penetrates cover member 23 to extend to a position above the opening of inner vessel 22, and forms a nozzle unit 24 that supplies the liquid IPA to inner vessel 22. In FIG. 4, a reference numeral V7 indicates an opening/closing valve that connects/disconnects supplying unit 2 with accommodating unit 3. Accommodating unit 3 is a liquid tank including an accommodating unit body 31 and a cover member 32 that closes an opening at the top side of accommodating unit body 31, and may accommodate the liquid IPA which is capable of being used for the wafer processings several times.

A communication line (a communication path) 507 that connects between the side periphery wall of outer vessel 21 and cover member 32 of accommodating unit 3, is formed between outer vessel 21 and accommodating unit 3. Communication line 507 serves as communicating the atmosphere within outer vessel 21 with a gas-phase atmosphere above the liquid IPA accommodated in accommodating unit 3. In FIG. 4, a reference numeral V8 indicates an opening/closing valve that connects/disconnects supplying unit 2 with accommodating unit 3.

Accommodating unit 3 is configured such that the lower end of the liquid IPA accommodated within accommodating unit 3 is positioned higher than the discharging port of nozzle unit 24 inserted within outer vessel 21. As a result, when opening/closing valve V7 of flow down line 505 is opened in a state where opening/closing valve V8 of communication line 507 is opened, the liquid IPA may flow down within flow down line 505 by the difference of liquid levels between the liquid IPA in accommodating unit 3 and the discharging port of nozzle unit 24. As such, supplying unit 2 and accommodating unit 3 are arranged in a position relationship which is capable of supplying the liquid IPA to inner vessel 22 without using, for example, a pump.

As illustrated in FIGS. 1 and 3, outer vessel 21 is provided with a drain line 509 that discharges the liquid stored in outer vessel 21 or a draw-off line 506 that draws off the IPA within outer vessel 21 when the pressure in outer vessel 21 exceeds a preset value. Drain line 509 is provided with an opening/closing valve V10, and draw-off line 506 is provided with a relief valve RV1 and a safety valve SV3.

Herein, relief valve RV1 and safety valve SV3 of draw-off line 506 become a closed state at a pressure equal to or lower than an individual setting value, when opening/closing valves V7 to V10 of each of the lines 505, 507 to 509 as described above are closed, the inside of outer vessel 21 becomes a sealed atmosphere. When the liquid IPA is heated under the sealed atmosphere, the temperature and pressure of the IPA may be increased to obtain a supercritical IPA.

As illustrated in FIG. 1, the upper portion of accommodating unit 3 (for example, cover member 32) is provided with an exhaust line 504 that exhausts the gas-phase side atmosphere within accommodating unit 3 when the liquid IPA is being received, and a draw-off line 503 that draws off the atmosphere within accommodating unit 3 to outside when the pressure within accommodating unit 3 exceeds a preset value. In FIG. 1, a reference numeral V6 provided in exhaust line 504 indicates an opening/closing valve, and reference numerals RV2 and SV2 provided in draw-off line 503 indicate a relief valve and a safety valve, respectively.

An IPA accommodating line 501 that receives the liquid IPA from the outside is connected to the lower side of accommodating unit 3 (for example, the bottom surface of accommodating unit body 31). IPA accommodating line 501 is connected to recovery tank 4 that collects the IPA having been used in processing chamber 1 via a discharging line 502, and can supply the IPA collected in recovery tank 4 toward accommodating unit 3. Each of reference numerals V1, V2, and V5 provided in IPA accommodating line 501 and discharging line 502 indicates an opening/closing valve, and each of reference numerals F1 and F2 indicates a particle filter.

Recovery tank 4 is connected to processing chamber 1 via a discharging line 510 in which an opening/closing valve V11 and a cooler 62a are interposed, and may store the liquid IPA obtained by cooling and liquefying the IPA discharged from processing chamber 1. Draw-off line 506 of supplying unit 2 and draw-off line 503 of accommodating unit 3 are joined to discharging line 510, and the IPA drawn-off from supplying unit 2 and accommodating unit 3 may be cooled by a cooler 62b to be collected.

A reference numeral 41 provided in recovery tank 4 indicates a liquid level gage that measures the level of the liquid IPA in recovery tank 4, a reference numeral 512 having an opening/closing valve V3 indicates a nitride supplying line that transports the liquid IPA in recovery tank 4 by applying pressure, and a reference numeral 511 having a safety valve SV1 indicates a draw-off line that draws off the atmosphere within recovery tank 4 to the outside when the pressure in recovery tank 4 exceeds a preset pressure.

In the wafer processing apparatus including a configuration as described above, for example, opening/closing valves V1 to V11, power supplying units 16, 26, and liquid level gage 41 of processing chamber 1, supplying unit 2, accommodating unit 3 and recovery tank 4 are connected to a control unit 6. Control unit 6 includes a computer with a CPU and a storage unit which are not illustrated. The storage unit has a program recorded therein, in which a group of control steps (commands) related to the operations of the wafer processing apparatus including, for example, carrying-in a wafer W where the surface of which is wet by liquid, removing the liquid by the supercritical IPA, and carrying-out wafer W. The program is stored in a storage medium such as, for example, a hard disk, a compact disk, a magneto-optical disk, and a memory card and is installed in the computer therefrom.

Hereinafter, the operations of the wafer processing apparatus will be described with reference to the operational view in FIGS. 5 to 9. In FIGS. 5 to 9, some of the reference numerals illustrated in FIG. 1 are omitted.

A liquid processing in which various cleaning liquids are supplied to the surface of wafer W to remove minute dusts or native oxide layers on the surface of wafer W, is performed by a single type spin cleaning apparatus in the upstream side of the wafer processing apparatus. A dry preventing liquid such as, for example, IPA is supplied to wafer W having been liquid-processed, and wafer W is transferred to a wafer transport arm in a state where the IPA is attached to the surface of wafer W, and is transported to the wafer processing apparatus of the present exemplary embodiment.

Figure 5:
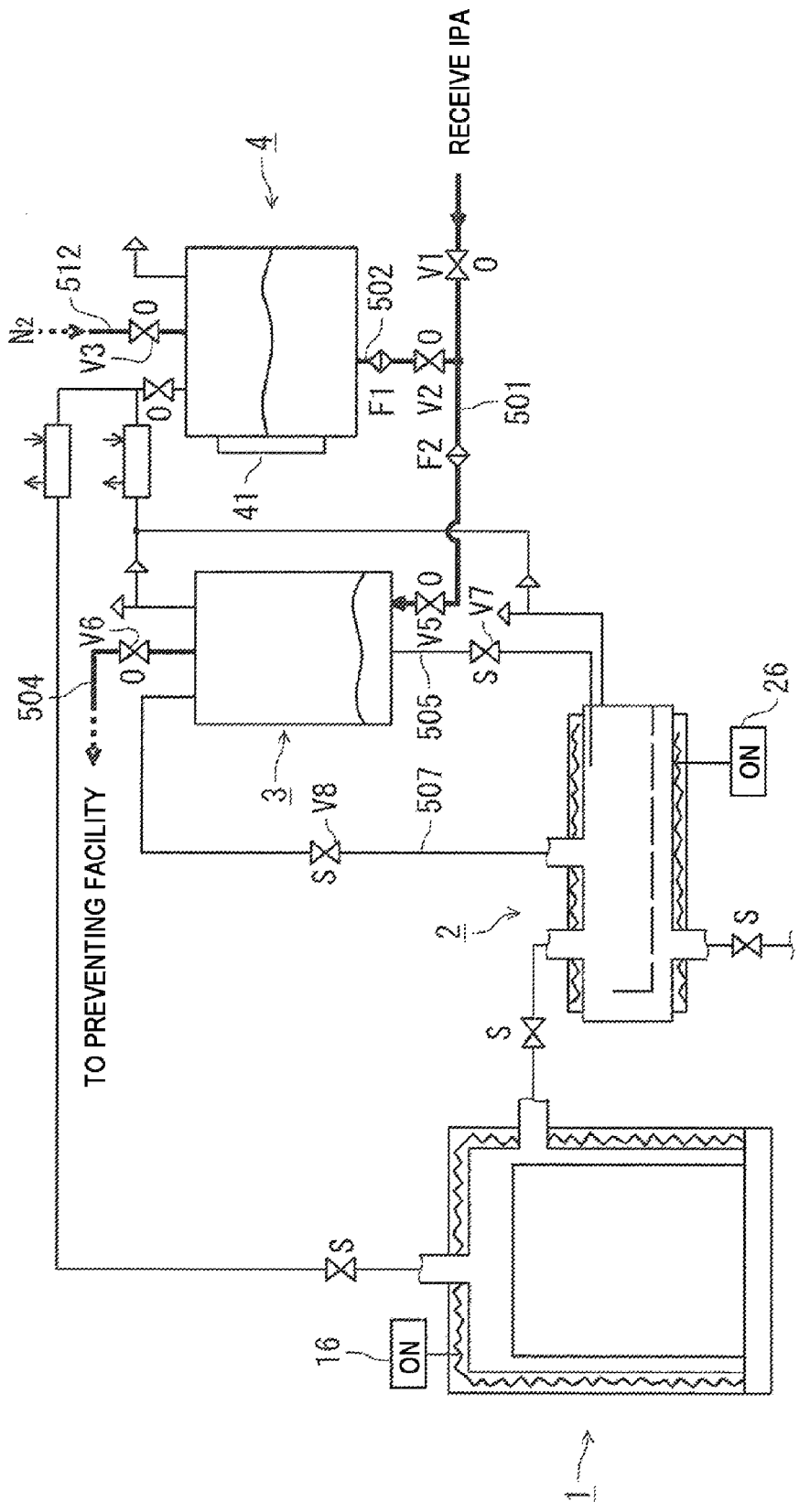
FIG. 5 is a first explanatory view illustrating an operation of the wafer processing apparatus.

FIG. 5 illustrates a wafer processing apparatus at the time of receiving the liquid IPA from the outside as the amount of the liquid IPA in accommodating unit 3 becomes lowered, before wafer W is carried-in to processing chamber 1.

In FIG. 5, each of opening/closing valves V1, V2, V5 of IPA accommodating line 501 that receives the liquid IPA from the outside and discharging line 502 that discharges the liquid IPA from recovery tank 4 is opened (In FIG. 5, a reference numeral "O" is applied thereto, which is the same in the following figures). In addition, opening/closing valve V6 of exhaust line 504 provided in accommodating unit 3 is also opened, and the inside of accommodating unit 3 becomes, for example, an air pressure of atmosphere. Furthermore, opening/closing valves V7, V8 of flow down line 505 and communication line 507, which connect accommodating unit 3 with supplying unit 2, are closed (In FIG. 5, a reference numeral "S" is applied thereto, which is the same in the following figures).

First, a nitride gas for pressurization is received from nitride supplying line 512 of recovery tank 4 to transport a predetermined amount of the liquid IPA to accommodating unit 3 while monitoring the liquid level of liquid level gage 41. In order to supplement the IPA lost by, for example, an evaporation, a predetermined amount of the liquid IPA is received from the outside while checking on the supply amount by, for example, a flow rate meter.

Herein, even though a liquid level gage is not provided in accommodating unit 3 of the present exemplary embodiment, the amount of the liquid IPA within accommodating unit 3 can be checked from the difference between the receiving amount and discharging amount of the liquid IPA. In order to check the amount of the liquid IPA more precisely, for example, a drain line may be provided in accommodating unit 3, then the liquid IPA may be received in accommodating unit 3 after the inside of accommodating unit 3 is empty by discharging the liquid IPA from accommodating unit 3 through the drain line. A liquid level gage may surely be provided in accommodating unit 3.

Figure 6:
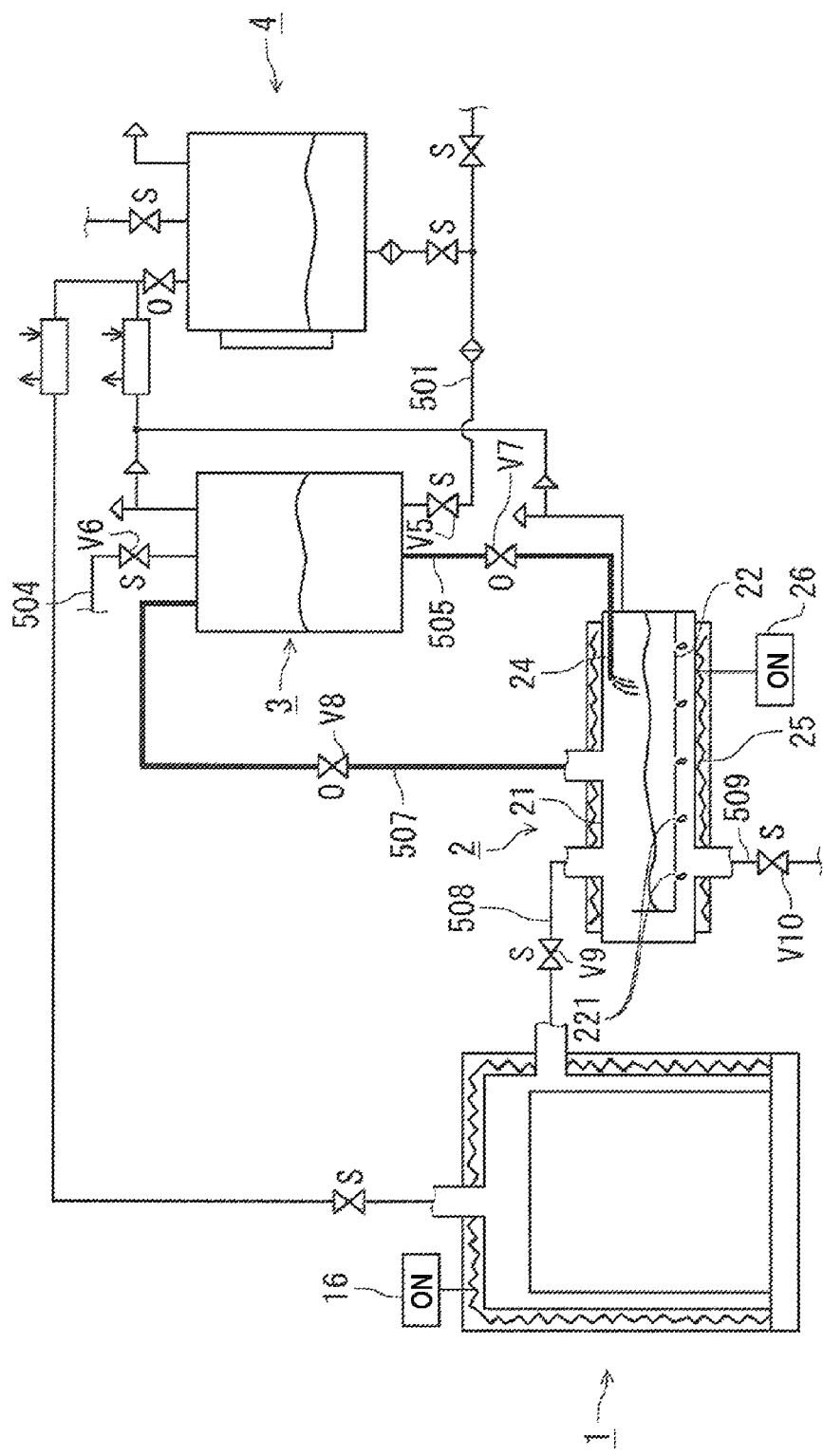
FIG. 6 is a second explanatory view illustrating the operation of the wafer processing apparatus.

When a predetermined amount of the liquid IPA is transported to accommodating unit 3 as described above, opening/closing valves V5, V6 of IPA accommodating line 501 and exhaust line 504 are closed, then opening/closing valves V7, V8 of flow down line 505 and communication line 507, which connect accommodating unit 3 with supplying unit 2, are opened (see, e.g., FIG. 6).

By opening opening/closing valve V8 of communication line 507, the atmosphere within outer vessel 21 of supplying unit 2 is communicated with the gas-phase side atmosphere of accommodating unit 3, and the pressures of these atmospheres are adjusted to be the same approximately.

When opening/closing valve V7 of flow down line 505 is opened, the liquid IPA within accommodating unit 3 flows down in flow down line 505 to be discharged from nozzle unit 24 into outer vessel 21, by the difference of liquid levels between the liquid IPA in accommodating unit 3 and the discharging port of nozzle unit 24. As illustrated in FIG. 3, the discharging port of nozzle unit 24 is arranged at a position above the opening of inner vessel 22, and the liquid IPA discharged from nozzle unit 24 is accommodated in inner vessel 22. At that time, opening/closing valves V9, V10 of other lines 508, 509 which are provided in supplying unit 2 are closed.

Herein, power supplying unit 26 that supplies power to heater 25 is always in a "ON" state, the portion of outer vessel 21 to be heated (side periphery wall of outer vessel 21) is heated to a critical temperature of IPA or more, for example, 250. The temperature of inner vessel 22, which is arranged within outer vessel 21 in a state where inner vessel 22 is spaced from the portion to be heated, is in a state lower than 250.

When the liquid IPA is supplied from nozzle unit 24 toward inner vessel 22, some of the liquid IPA is heated to be evaporated by contacting with inner vessel 22. However, inner vessel 22 is deprived of the evaporation heat by the evaporation so that the temperature becomes lowered because the thermal capacity of inner vessel 22 is relatively small as described above. As such, when the liquid IPA is continuously supplied to inner vessel 22, the temperature of which becomes lowered, a liquid storage is gradually formed in inner vessel 22.

The liquid IPA stored in inner vessel 22 passes through opened holes portions 221 formed in the bottom portion of inner vessel 22 and drops toward the side periphery wall of outer vessel 21 which is the portion to be heated which is heated by heater 25, and when the liquid IPA contacts with the side periphery wall, the contacted liquid IPA is evaporated to become an IPA gas. As a result, the pressure within outer vessel 21 is raised. However, the atmosphere within outer vessel 21 and the atmosphere within accommodating unit 3 are communicated with each other through communication line 507, and then, the pressures of the both atmospheres are adjusted to be the same approximately.

The inner atmospheres of outer vessel 21 and accommodating unit 3 are adjusted to be the same approximately, and as a result, the liquid IPA discharged from nozzle unit 24 is not pushed again by the pressure rise in outer vessel 21, and the liquid IPA may be transported continuously only using the difference of the liquid levels.

In addition, inner vessel 22 is provided and the dropping amount of the liquid IPA from opened holes portions 221 of the inner vessel 22 is sufficiently lowered in comparison with the amount of the liquid IPA supplied from accommodating unit 3 to supplying unit 2. As a result, supplying unit 2 and accommodating unit 3 may be separated after the transport of the liquid IPA is completed in a state where the liquid IPA is stored in inner vessel 22.

The pipe or opening/closing valve V7 in flow down line 505 has to have a pressure-resistance property, as the inside of outer vessel 21 that accommodates the supercritical IPA becomes a high temperature and high pressure state. However, it is difficult to adopt the large-diameter one to avoid the cost increase. For that reason, when liquid IPA is directly supplied toward a portion of outer vessel 21 to be heated without an installation of inner vessel 22, the evaporation amount of the IPA per unit time may exceed the amount of the liquid IPA that flows down in flow down line 505.

At that time, since the atmosphere within outer vessel 21 is communicated with the atmosphere within accommodating unit 3, when the supplied IPA is entirely evaporated, the evaporated IPA flows in communication line 507 to run into accommodating unit 3 and then the IPA is cooled to return to liquid IPA. As a result, there is a concern that IPA is circulated between accommodating unit 3 and supplying unit 2 and no supercritical IPA is obtained.

Meanwhile, when a rapid evaporation of the liquid IPA accommodated in outer vessel 21 is suppressed by performing, for example, the turning ON/OFF of heater 25, it takes a long time to heat/cool outer vessel 21 having a thick thickness. As a result, there is a concern that it becomes a limitation when processing wafer W, or a separate cooling mechanism for outer vessel 21 is needed.

Therefore, the wafer processing apparatus in the present exemplary embodiment is configured such that inner vessel 22 is arranged in a state where inner vessel 22 is spaced from the portion to be heated (the side periphery wall of outer vessel 21) which is heated by heater 25, and the liquid IPA received from accommodating unit 3 is firstly received in inner vessel 22 and slowly drops through opened holes portions 221. By doing so, the transport of the liquid IPA from accommodating unit 3 to supplying unit 2 may be completed in a state where the liquid IPA is stored in outer vessel 21 (in inner vessel 22 disposed inside outer vessel 21).

The transport amount of the liquid IPA from accommodating unit 3 to supplying unit 2 may be adjusted by, for example, checking the relationship of the liquid level of the liquid IPA in accommodating unit 3, the amount of the liquid IPA that flows down in flow down line 505, and the recovery amount from communication line 507 by means of, for example, a preliminary experiment.

Figure 7:
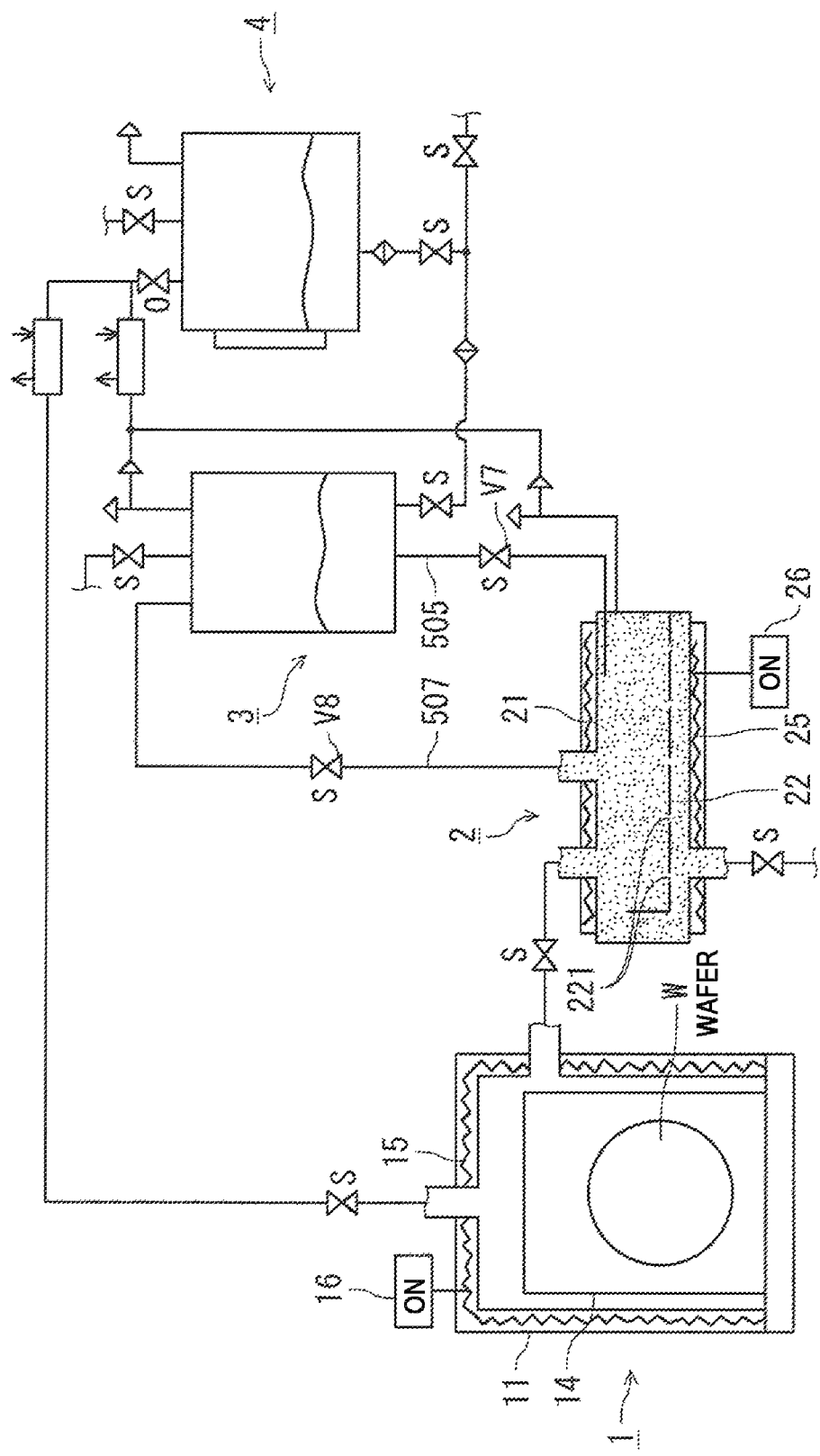
FIG. 7 is a third explanatory view illustrating the operation of the wafer processing apparatus.

When opening/closing valves V7, V8 of flow down line 505 and communication line 507 are opened by a preset time based on the flow down amount of the liquid IPA and a predetermined amount of the liquid IPA is transported to supplying unit 2, then these opening/closing valves V7, V8 are closed to seal outer vessel 21 (see, e.g., FIG. 7).

In the inside of outer vessel 21, the liquid IPA drops continuously from inner vessel 22 toward the portion to be heated, and the pressure and temperature in sealed outer vessel 21 are gradually increased. Since the inside of inner vessel 22 is communicated with the inner atmosphere of outer vessel 21 through the opening, IPA that receives a heat from the entire side periphery wall of outer vessel 21, which is the portion to be heated, flows in the inside of inner vessel 22 through the opening side and then contacts with the liquid IPA to heat the liquid IPA.

As describe above, when the IPA is continuously heated within sealed outer vessel 21, the temperature and pressure of the inner atmosphere are increased and the temperature and pressure of the IPA exceed a critical point. Therefore, outer vessel 21 becomes a state where outer vessel 21 is filled with supercritical IPA.

In parallel to these operations, in processing chamber 1, wafer W having completed a liquid processing and being transported therein by an outer wafer transport arm, is transferred on holding plate 14. Holding plate 14 slides toward chamber body 11, and cover member 13 thereof blocks opening 12 to seal processing chamber 1. At this time, power supplying unit 16 that supplies a power to heater 15 is always in an "ON" state, the processing space within processing chamber 1 is heated to a critical temperature of IPA or more, for example, 250.

When wafer W is carried-in to the heated processing space, opening/closing valve V9 of supplying line 508 is opened before the dry preventing IPA attached on wafer W is evaporated. When opening/closing valve V9 is opened, the supercritical IPA within supplying unit 2 (outer vessel 21) expands to flow in supplying line 508, thereby being flowed in the processing space (see, e.g., FIG. 8). At this time, opening/closing valve V11 of discharging line 510 that connects processing chamber 1 with recovery tank 4 is closed.

IPA may be supplied into the processing space while maintaining the supercritical state thereof by means of, for example, (1) making the temperature and pressure of the supercritical IPA prepared in supplying unit 2 to be sufficiently higher than a critical temperature and a critical pressure thereof; (2) making the volume of the processing space or the volume of supplying line 508 to be small as possible to suppress the expansion rate of the supercritical IPA; (3) expanding the supercritical IPA in a state similar to the isothermal and uniform pressure by heating the inside of the processing space in advance by heater 15 and increasing the output of heater 25 at supplying unit 2 side such that the temperatures and pressures in outer vessel 21 are maintained to the same values before and after opening/closing valve V9 is opened.

When the supercritical IPA supplied into the processing space contacts with the liquid IPA attached on wafer W, the liquid IPA is evaporated by absorbing a heat from the supercritical IPA to be in a supercritical state. As a result, the liquid IPA of the surface of wafer W is substituted with the supercritical IPA. Since there is no interface between liquid IPA and supercritical IPA in an equilibrium state, the fluid on the surface of wafer W may be substituted with the supercritical IPA without causing a pattern collapse.

Figure 8:
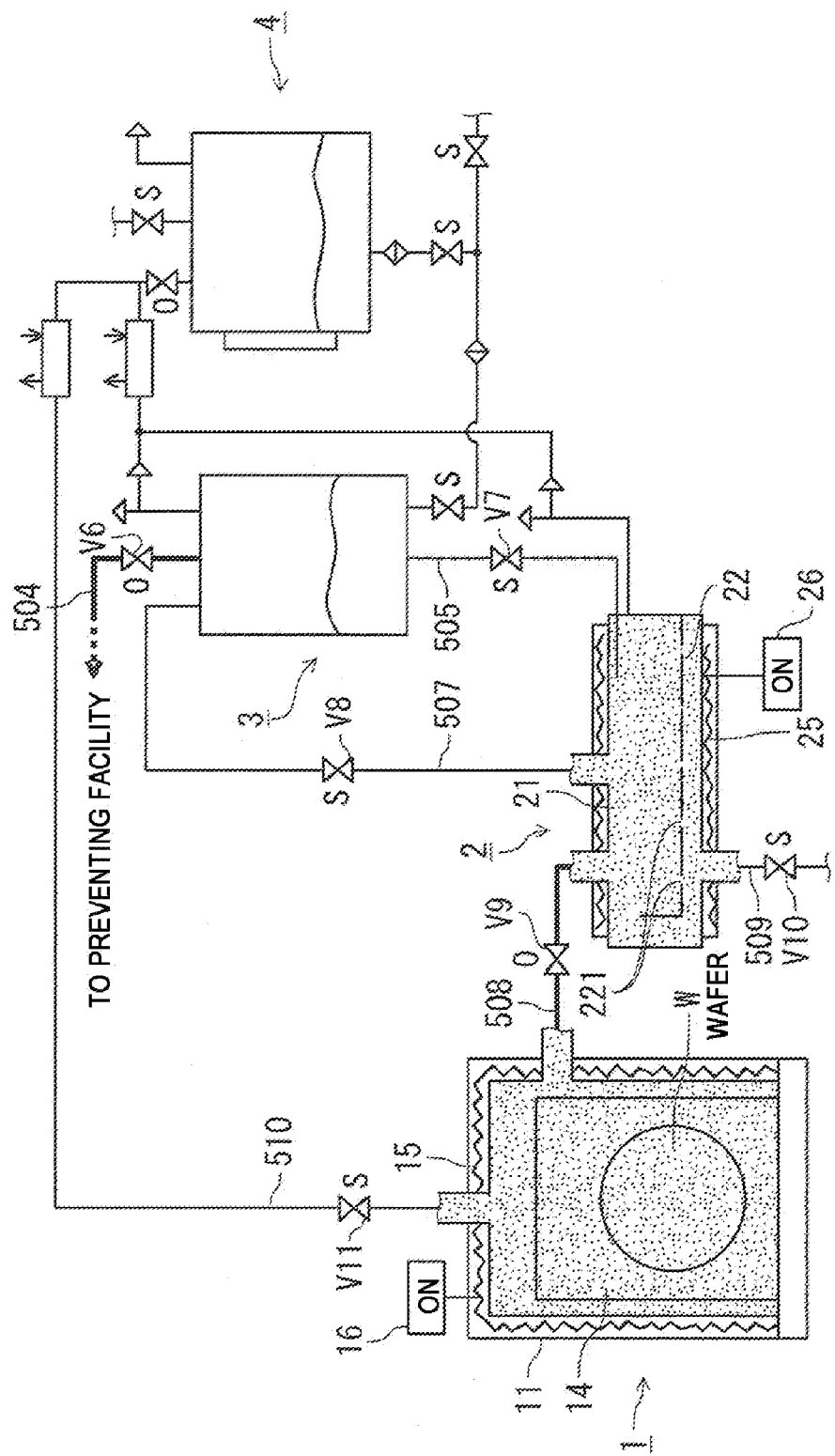
FIG. 8 is a fourth explanatory view illustrating the operation of the wafer processing apparatus.

In parallel to the operations as described above, valve V6 of exhaust line 504 may be opened to lower the pressure within accommodating unit 3 by the atmospheric pressure, as illustrated in FIG. 8, so as to prepare for the transport or accommodation of the next liquid IPA.

Figure 9:
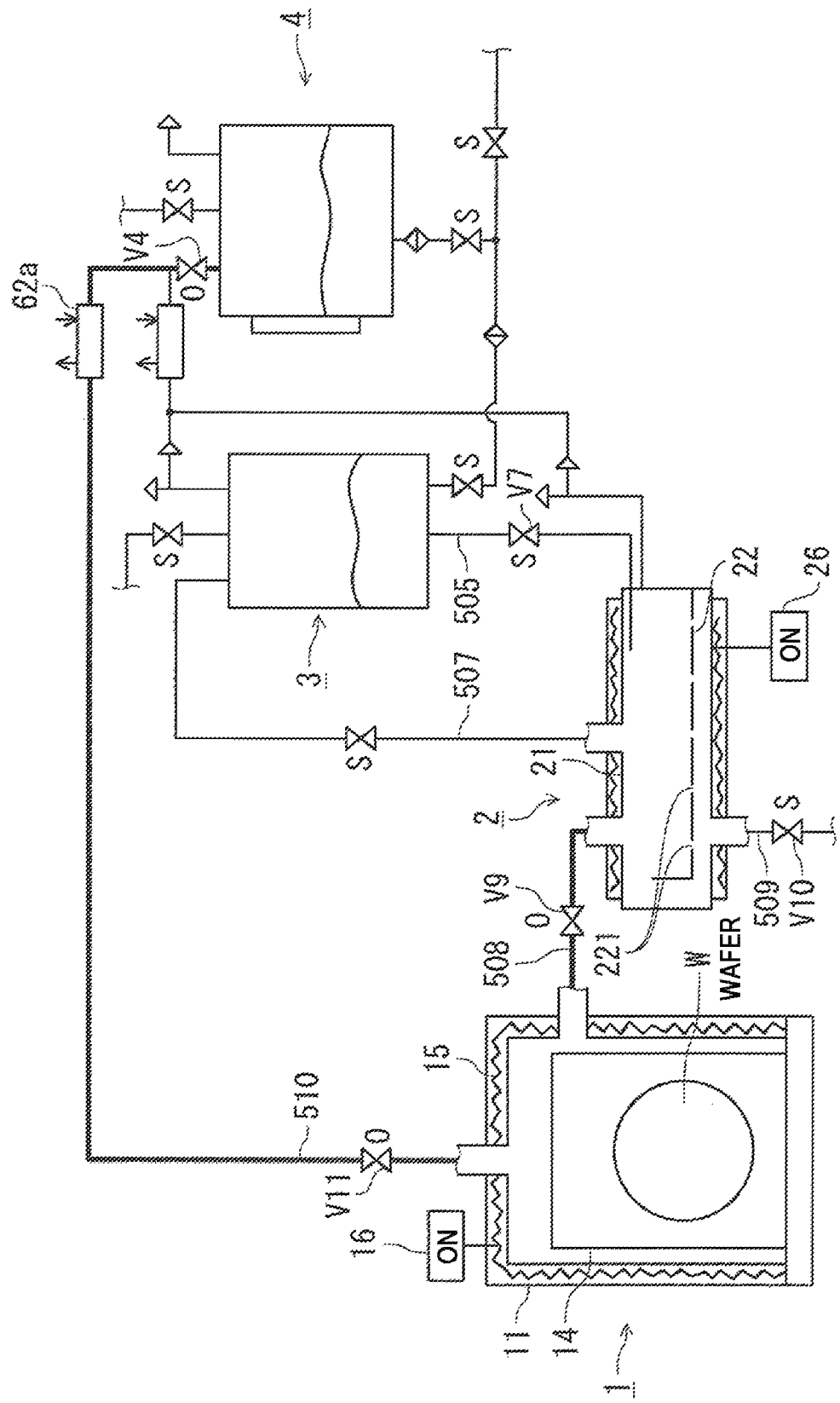
FIG. 9 is a fifth explanatory view illustrating the operation of the wafer processing apparatus.

As described above, when a preset time elapses after the supercritical IPA is supplied into the processing space and the surface of wafer W becomes a state where the surface of wafer W is substituted with the supercritical IPA, as illustrated in FIG. 9, opening/closing valve V11 of discharging line 510 is opened to discharge the supercritical IPA in processing chamber 1 and supplying unit 2 toward recovery tank 4. The IPA that flows in discharging line 510 is cooled by cooler 62$a$ to be liquefied IPA, and is collected into recovery tank 4.

The pressure within processing chamber 1 or supplying unit 2 which discharges the IPA is lowered step by step, but the temperature inside of processing chamber 1 or supplying unit 2 is maintained to a temperature higher than the boiling point of IPA (82.4) at an atmospheric pressure. As a result, even though the IPA in the processing space is changed from a supercritical state to a gaseous state, no interface is formed between the supercritical state and gas. Therefore, wafer W may be dried without applying the surface tension to the pattern formed on the surface thereof. Inner vessel 22 arranged in a state where inner vessel 22 is spaced from the portion to be heated is deprived of heat according to the expansion of the IPA, and the temperature of inner vessel 22 is lowered. When the discharging of the IPA is completed, opening/closing valves V9, V11 of supplying line 508 and discharging line 510 are closed to be on standby.

When a processing of removing a liquid attached on the surface of wafer W is completed by the process as described above, then holding plate 14 moves to transfer wafer W into the outer wafer transport arm. The processing is completed. The wafer transport arm carries-in wafer W to, for example, a carrier that receives a plurality of wafers W, and as a result, a series of operations are completed.

As such, a processing for wafers W of plural of sheets is performed by repeating the operations described using FIGS. 6 to 9 while transporting the liquid IPA from recovery tank 4 to accommodating unit 3 every a predetermined number of processings.

The wafer processing apparatus according to the present exemplary embodiments of the present disclosure provides the following effects. Supplying unit 2 that supplies a liquid IPA to processing chamber 1 as a supercritical IPA is provided with inner vessel 22 in a state where inner vessel 22 is spaced from the portion of outer vessel 21 to be heated which is heated by heater 25, the liquid IPA received from accommodating unit 3 is received first into inner vessel 22, and then the liquid IPA drops to the portion to be heated. Therefore, the liquid IPA may be supplied slowly to the portion to be heated. As a result, a sudden rise of the pressure within outer vessel 21 is suppressed when the liquid IPA is transported, and the liquid IPA may readily be transported.

Figure 10:
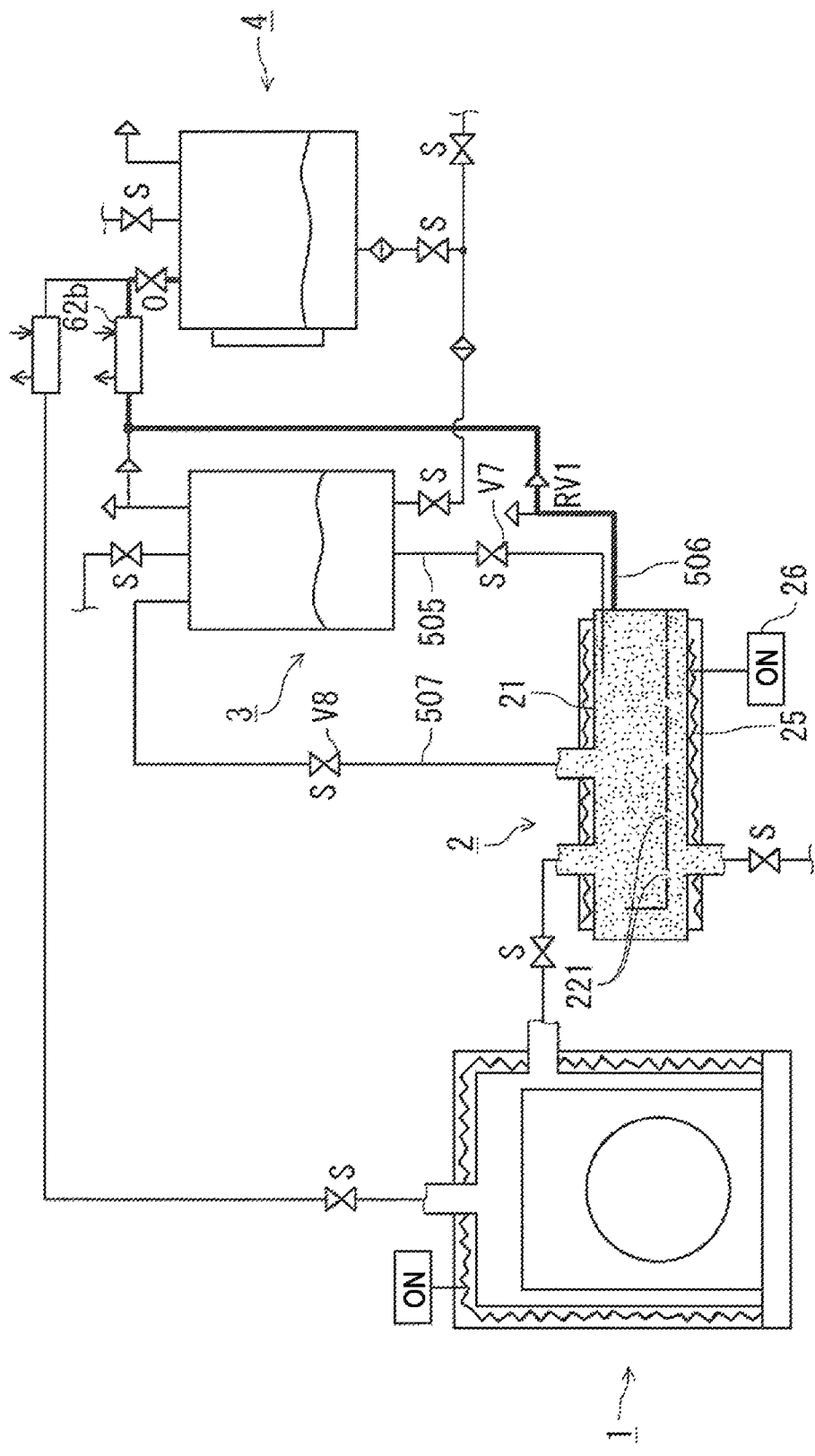
FIG. 10 is an explanatory view illustrating a wafer processing apparatus according to another exemplary embodiment of the present disclosure.

FIG. 10 illustrates a method that controls the pressure and amount of the supercritical IPA within outer vessel 21 using relief valve RV1 provided in draw-off line (draw-off path) 506. In this case, when the liquid IPA is transported from accommodating unit 3 to supplying unit 2 by flowing down the liquid IPA in flow down line 505 described with reference to FIG. 6, the opening times of opening/closing valves V7, V8 of flow down line 505 and communication line 507 are made to be longer to transport the liquid IPA of an amount larger than a necessary amount.

It is the same to a case described using FIG. 7, in which accommodating unit 3 is separated from supplying unit 2 by closing opening/closing valves V7, V8, and the IPA within outer vessel 21 is increased in temperature and pressure by dropping the liquid IPA from inner vessel 22 to the portion of outer vessel 21 to be heated. At this time, the excess amount of the liquid IPA is transported into outer vessel 21, then the pressure within outer vessel 21 exceeds the setting value of relief valve RV1, and some of the IPA within outer vessel 21 is drawn off toward recovery tank 4 from draw-off line 506, as illustrated in FIG. 10.

As a result, when the pressure within outer vessel 21 is lowered step by step and the pressure becomes lower than the operation pressure of relief valve RV1, relief valve RV1 is closed. As a result, the inside of outer vessel 21 becomes a state where the supercritical IPA with the same pressure and the same amount is accommodated for every processing. Therefore, when the transport amount of the liquid IPA is checked only by the opening times of opening/closing valves V7, V8 without providing a liquid level gage, the supercritical IPA in a stable state may be supplied for every processing.

The method of transporting liquid IPA from accommodating unit 3 to supplying unit 2 is not limited to a case where the difference of the liquid levels of the liquid IPA is used, but the method may use a transport by pressure using nitrogen gas or a liquid transport pump. Since the sudden rise of the pressure within outer vessel 21 is suppressed by arranging inner vessel 22 in a state where inner vessel 22 is spaced from the portion of outer vessel 21 to be heated, the liquid IPA may be transported into outer vessel 21 with a relative small force.

Supplying unit 2 illustrated in FIG. 3 is configured such that inner vessel 22 is provided in a position spaced from the portion of outer vessel 21 to be heated (inner wall surface of outer vessel 21), but inner vessel 22 may not be spaced from the portion to be heated perfectly. In a case where the liquid IPA is firstly received with inner vessel 22 in comparison to a case where the liquid IPA received from accommodating unit 3 directly contacts with the portion of outer vessel 21 to be heated, a member constituting inner vessel 22 may contact with the portion of outer vessel 21 to be heated when a temperature difference which may suppress a sudden evaporation of the liquid IPA is formed between inner vessel 22 and the portion of outer vessel 21 to be heated.

The shape of outer vessel 21 or inner vessel 22 is not limited to a shape as illustrated in FIG. 3. For example, a dish-shaped inner vessel 22, a top part of which is opened, may be arranged in a cylindrical-shaped outer vessel 21 in which the central axis thereof extends along to a vertical direction, and a plurality of opened holes portions 221 may be formed in the bottom surface of inner vessel 22.

Further, a raw material of a high temperature and high pressure fluid which is used to dry wafer W is not limited to IPA, but for example, the raw material may use a fluorine-containing organic solvent such as, for example, HydroFluoro Ether (HFE), HydroFluoro Carbon (HFC) and PerFluoro Carbon (PFC). Further, the high temperature and high pressure fluid state is not limited to a supercritical state. A case where raw material is made to a subcritical state (for example, in a case of IPA where the temperature is in a range of 100 to 300 and the pressure is in a range of 1 MPa to 3 MPa) and wafer W is dried using the subcritical fluid, may be included in the technical range of the present disclosure.

Furthermore, a processing performed in the present disclosure is not limited to a drying process in which the fluid on the surface of wafer W is removed. The present disclosure may apply to, for example, a cleaning and drying process where a processing of removing a resist film from wafer W by contacting wafer W with IPA in a supercritical state after performing a patterning using the resist film and a processing of drying wafer W are collectively performed.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus comprising:
a processing chamber configured to dry a substrate using a high temperature and high pressure fluid;
a raw material accommodating unit configured to accommodate a raw material in a liquid state; and
a supplying unit configured to supply the raw material received from the raw material accommodating unit to the processing chamber in a state of high temperature and high pressure fluid,
the supplying unit comprising:
a sealable outer vessel configured to be connected to the processing chamber through a high temperature and high pressure fluid supplying path having an opening/closing valve and connected to the raw material accommodating unit through a raw material supplying path having an opening/closing valve;
a heating mechanism configured to heat the outer vessel;
an inner vessel provided within the outer vessel while communicating with the inner atmosphere of the outer vessel and configured to receive a raw material from the raw material accommodating unit; and
opened holes portions formed in the inner vessel to drop the raw material received from the raw material accommodating unit toward a portion of the outer vessel to be heated which is heated by the heating mechanism,
wherein, after a raw material is accommodated in the inner vessel, the raw material is contacted with the portion to be heated and then is heated under the atmosphere of the sealed outer vessel thereby obtaining a high temperature and high pressure fluid to be supplied to the processing chamber.

2. The substrate processing apparatus of claim 1, wherein the inner vessel is provided within the outer vessel in a state where the inner vessel is spaced from the portion to be heated.

3. The substrate processing apparatus of claim 1, wherein the raw material accommodating unit is disposed in a position higher than the supplying unit so as to flow down the raw material therein toward the inner vessel through the raw material supplying path, and
a communication path having an opening/closing valve is provided between the raw material accommodating unit and the outer vessel so as to communicate the atmosphere in the raw material accommodating unit with the atmosphere in the outer vessel when the raw material flows down.

4. The substrate processing apparatus of claim 1, wherein the thermal capacity of the inner vessel is smaller than that of the outer vessel.

5. The substrate processing apparatus of claim 1, wherein the outer vessel is connected to a discharging path having a relief valve for discharging some of the high temperature and high pressure fluid therein, until the pressure within the outer vessel becomes a setting pressure set in advance when the pressure within the outer vessel exceeds the setting pressure, and the supplying unit receives the raw material up to an amount exceeding the setting pressure from the raw material accommodating unit and then supplies the high temperature and high pressure fluid to the processing chamber after the relief valve is driven.

* * * * *